United States Patent [19]

Mange et al.

[11] Patent Number: 5,508,636
[45] Date of Patent: Apr. 16, 1996

[54] ELECTRONIC SYSTEM ORGANISED AS AN ARRAY OF CELLS

[75] Inventors: Daniel Mange, Saint-Sulpice; Pierre Marchal, Lausanne; Christian Piguet, Neuchâtel; Eduardo Sanchez, Saint-Sulpice, all of Switzerland

[73] Assignee: CSEM Centre Suisse D'Electronique Et De Microtechnique SA, France

[21] Appl. No.: 246,698

[22] Filed: May 20, 1994

[30] Foreign Application Priority Data

May 24, 1993 [CH] Switzerland .................. 01 555/93

[51] Int. Cl.$^6$ ............................................. H03K 19/177
[52] U.S. Cl. ...................... 326/38; 326/40; 326/10; 371/10.1; 371/22.2
[58] Field of Search ...................... 326/10, 12, 38, 326/39, 40; 371/8.1, 10.1, 10.2, 10.3, 22.2

[56] References Cited

U.S. PATENT DOCUMENTS

| | | | |
|---|---|---|---|
| 4,700,187 | 10/1987 | Furtek | 326/39 |
| 4,739,250 | 4/1988 | Tanizawa | 371/22.2 |
| 4,768,193 | 8/1988 | Takemae | 371/10.3 |
| 4,870,302 | 9/1989 | Freeman | 326/41 |
| 4,896,055 | 1/1990 | Fujii et al. | 371/22.2 |
| 5,434,514 | 7/1995 | Cliff et al. | 326/40 |

FOREIGN PATENT DOCUMENTS 661793  3/1976  U.S.S.R. .

*Primary Examiner*—Edward P. Westin
*Assistant Examiner*—Jon Santamauro
*Attorney, Agent, or Firm*—Parkhurst, Wendel & Burr

[57] ABSTRACT

The invention concerns a programmable integrated electronic system including an array of identical cells (53). Each cell includes functional components (530) capable, when they are correctly connected, of executing a given function, and programmable connecting means (a to h) for on the one hand connecting the functional components to each other and on the other hand connecting the cell to its neighbours. The present invention is characterised in that the system includes means of storing a first data item which defines the function of each of the cells in the array and in that each cell has means for extracting, from this first data item and its location the network, the programming word for its own function. In addition, means are provided for effecting the test of correct functioning of each cell and for reconfiguring the array where there are defective cells.

10 Claims, 4 Drawing Sheets

ELECTRONIC SYSTEM ORGANISED AS AN ARRAY OF CELLS

BACKGROUND OF THE INVENTION

The present invention relates to programmable integrated electronic systems in general and concerns in particular such systems which are organised as an array of identical cells and intrinsically have a reprogramming capability when one or more of the cells constituting the said array are faulty.

In addition to integrated circuits of the "ASIC" (Application Specific Integrated Circuits), which are designed to fulfil a function specific to one application and require lengthy development time, and circuits of the "Gate Array" type, which consist or an array of logic gates and can be configured, by means of one or two interconnection masks, to meet a given specification, a new type of integrated circuit has appeared in recent years, known as the "FPGA" (Field-Programmable Gate Array). These "FPGA" circuits, a description of which can be found in the book published under the title "Field-Programmable Gate Arrays" by Kluwer Academic Publishers, are programmable logic systems which may have a high degree of complexity. They consist of a set of logic blocks and connecting components (programmable switches) enabling the said logic blocks to be assembled in a configuration which meets a given specification. To use such systems, it is necessary to construct, from the specification for the envisaged application, a logic diagram with predefined modules and to convert this logic diagram, by means of a suitable software tool, into a series of connections distributed within the silicon substrate and connecting the different logic blocks so as to enable the system to function in accordance with the specification. Although having a higher performance than "Gate Arrays", since the logic blocks may carry out more complex functions, "FPGAs" nevertheless function in the same way as the former; that is to say, the cells are defined a priori and the program, which enables them to be interconnected and is defined from the specification of the application, is stored once and for all in the system memory or in the switches which define the function of the system. In these types of circuit there is no possibility of repair should one of the functional components fail.

SUMMARY OF THE INVENTION

Thus one object or the present invention is a programmable system which does not have the above-mentioned drawbacks.

Another object of the invention is a programmable system consisting of an array of identical cells and including means for storing the function of the array and means for determining, from the function of the array, the function of each cell, taking into account the location of the said cell and its environment.

Yet another object of the invention is a programmable system which includes an array of cells and means for detecting those of its cells which are defective.

Yet another object of the invention is a programmable system including an array of cells, means for detecting defective cells and means for reconfiguring the said array by deactivating the said defective cells.

These objects are achieved by virtue or the characteristics disclosed in the claims attached to the present description.

A particularly interesting advantage of the present invention lies in the intrinsic possibility of reconfiguring the array in the event of a failure of one or more cells, which considerably increases the reliability of the system. There are many applications, such as onboard electronic systems, for which this possibility of reconfiguration would constitute a very important asset.

Other objects, characteristics and advantages of the present invention will emerge more clearly from a reading of the following description of particular example embodiments, the said description being given purely for illustration and in relation to the accompanying drawings in which:

DETAILED DESCRIPTION OF THE PREFERRED EMBODIMENTS

Figure 1:
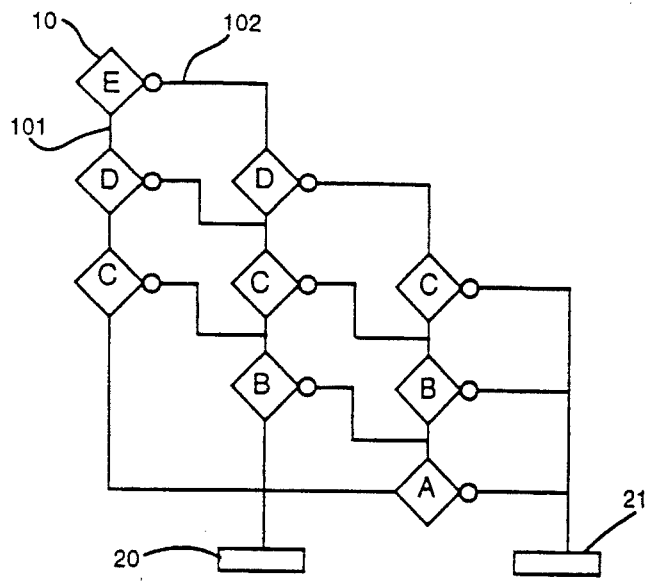
FIG. 1 shows a binary decision algorithm for the so-called "majority" function.

The diagram in FIG. 1 shows an example of a binary decision algorithm. This algorithm represents a so-called "majority" function, which has a logic "1" state at the output if at least three of the five variables A, B, C, D and E is in a logic "1" state. Each diamond represents a test operation on the variable whose name appears inside. Thus the diamond 10 represents a test operation on the variable E, which activates either the output 101 if the variable E is in the logic "1" state or the output 102 if the variable E is in the logic "0" state. The rectangles 20 and 21 represent the functions "Put the output S in the 1 state" and "Put the output S in the 0 state", respectively. According to this algorithm, the output S adopts the logic "1" value when at least three of the variables A, B, C, D and E are simultaneously in the logic "1" state and it adopts the logic "0" value in other cases.

Figure 2:
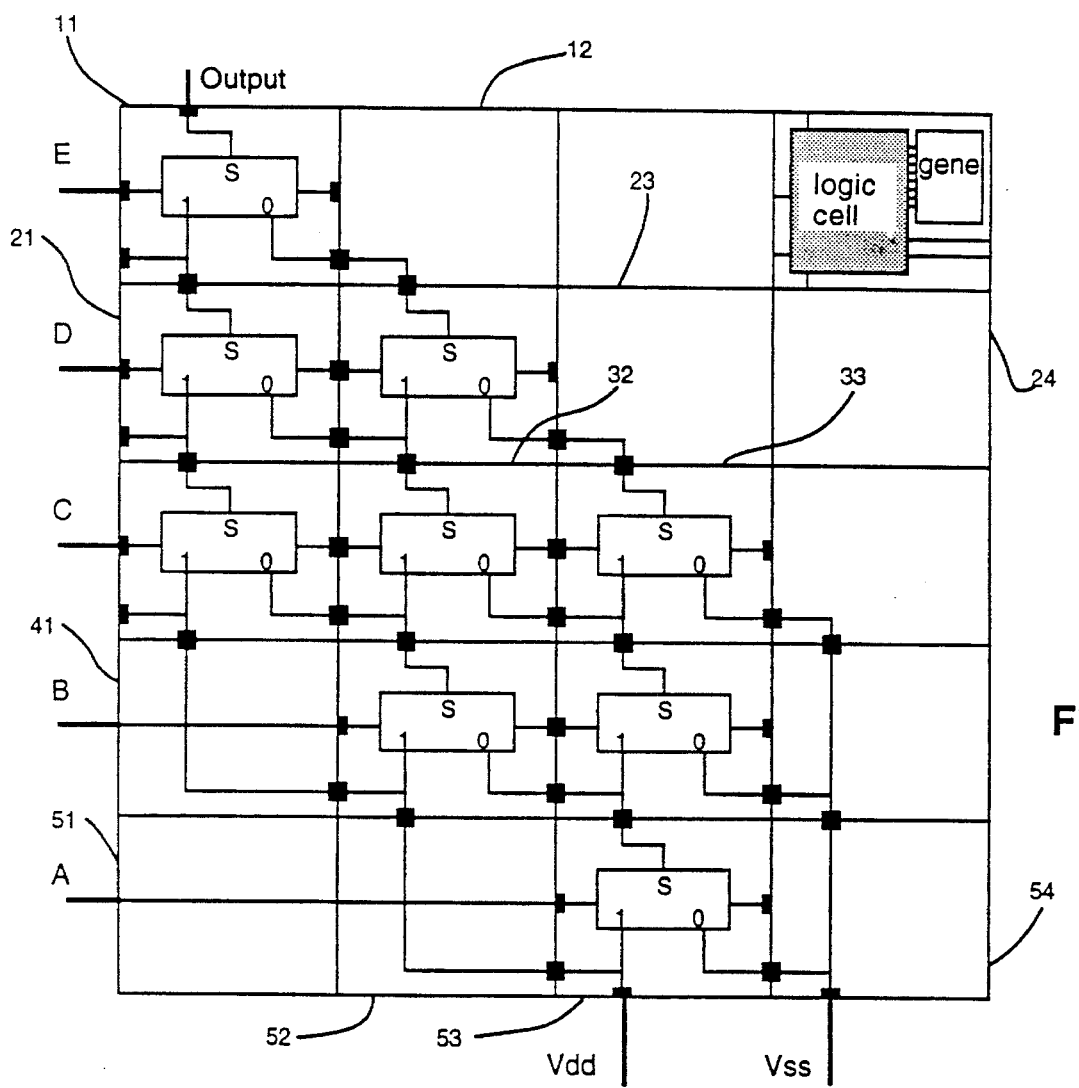
FIG. 2 shows an example of an implementation of the majority function by means of an array of identical cells consisting of multiplexing circuits.
Figure 3:
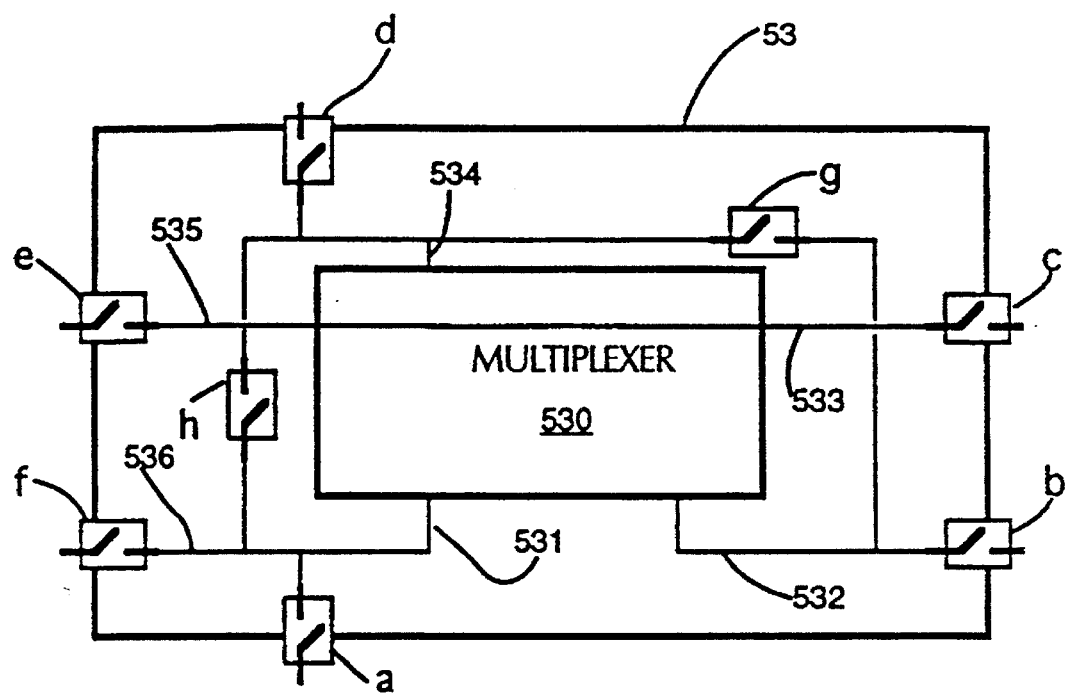
FIG. 3 shows a cell in the array of FIG. 2.

An example of "hardware" implementation of the algorithm of FIG. 1, by means of an array of identical cells, is shown in FIG. 2. Each cell carries out a test operation on a variable and is produced by means of a multiplexing circuit with two inputs and one output. It will be noted that the architecture of this array faithfully copies the representation of the algorithm shown in FIG. 1. Thus a first level is found which includes only one multiplexer (test of variable A), followed by a second level including two multiplexers (test of variable S), then a third level including three multiplexers (test of variable C), a fourth level including two multiplexers (test of variable D) and finally a fifth level including only a single multiplexer (test of variable E). Each cell, for example the cell 53 (shown in FIG. 3), has a multiplexer 530 having a first input 531 and a second input 532, a test input 533, an output 534 and a second test input, connected to the first one, 535. For the array of FIG. 2 to comply with the characteristics of the invention, it is necessary for each cell to have its own programming means, so that it can be configured so as to fulfil the correct function. These programming means consist of first switches a, b, c, d, e and f, which provide the cell-to-cell connections, and second switches g and h, which make it possible to effect certain connections internal to the cells which are required for some of them. In the cells such as the cell 32, the first switches a to f are all closed whilst the second switches g and h are open. In the cells such as the cell 54, only the switches a, d, f and h are closed, the other switches remaining open. In the cells such as the cell 52, it is only the switches c, e and g which are closed. In the cells such as 23, only the switches a and f are closed. In the cells such as the cell 33, it is the switches a, b, d, e and f which are closed. In the cell 51 only the switches c and e are closed. In the cells such as the cell 24, all the switches a to h are open. Thus, for the array in FIG. 2, eight switches are sufficient to program each cell so that it fulfils one of the seven different functions possible.

Figure 4:
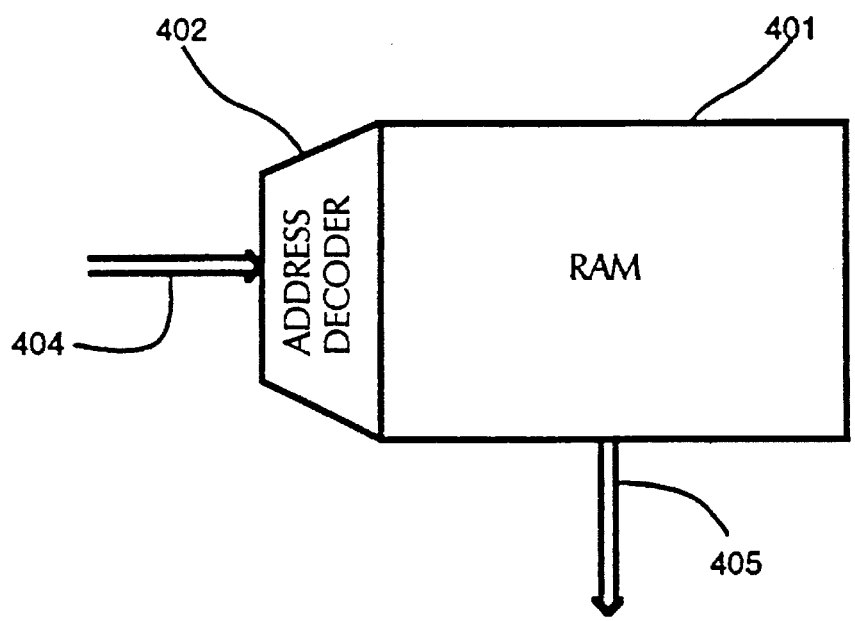
FIG. 4 is a block diagram of an example of a circuit enabling the cell gene to be reconstructed.

According to one characteristic of the invention, this programming is effected by means of a stored data item (or genome) representing the function of the array and common to all the cells on the one hand, and the code or the cell which is peculiar to the latter on the other hand. FIG. 4 shows a block diagram of a circuit 400 enabling the function of a cell to be determined from the array genome. The array genome is stored in a RAM-type memory 401. This memory is addressed by the cell code, applied to the inputs 404 of the address decoder 402, and delivers a word for programming the function of the cell at its output 405. With regard to the array in FIG. 2, this programing word (or gene) for the cell is an eight-bit word enabling the above-mentioned eight switches to be programmed. According to a first variant, each cell of the array holds the genome of the entire array and the means of determining its own gene, defining its function, from its own code. According to another variant, the genome is stored in a memory external to the cell and each cell is in a position to address the memory by applying to it its own code and to read its own gene. The code of each cell may consist of its coordinates in the array. Consequently it is easy to reconfigure the array by changing the coordinates of the cells. This may be in particular be made necessary in the event of a failure being noted in one or more cells in the array.

Figure 5:
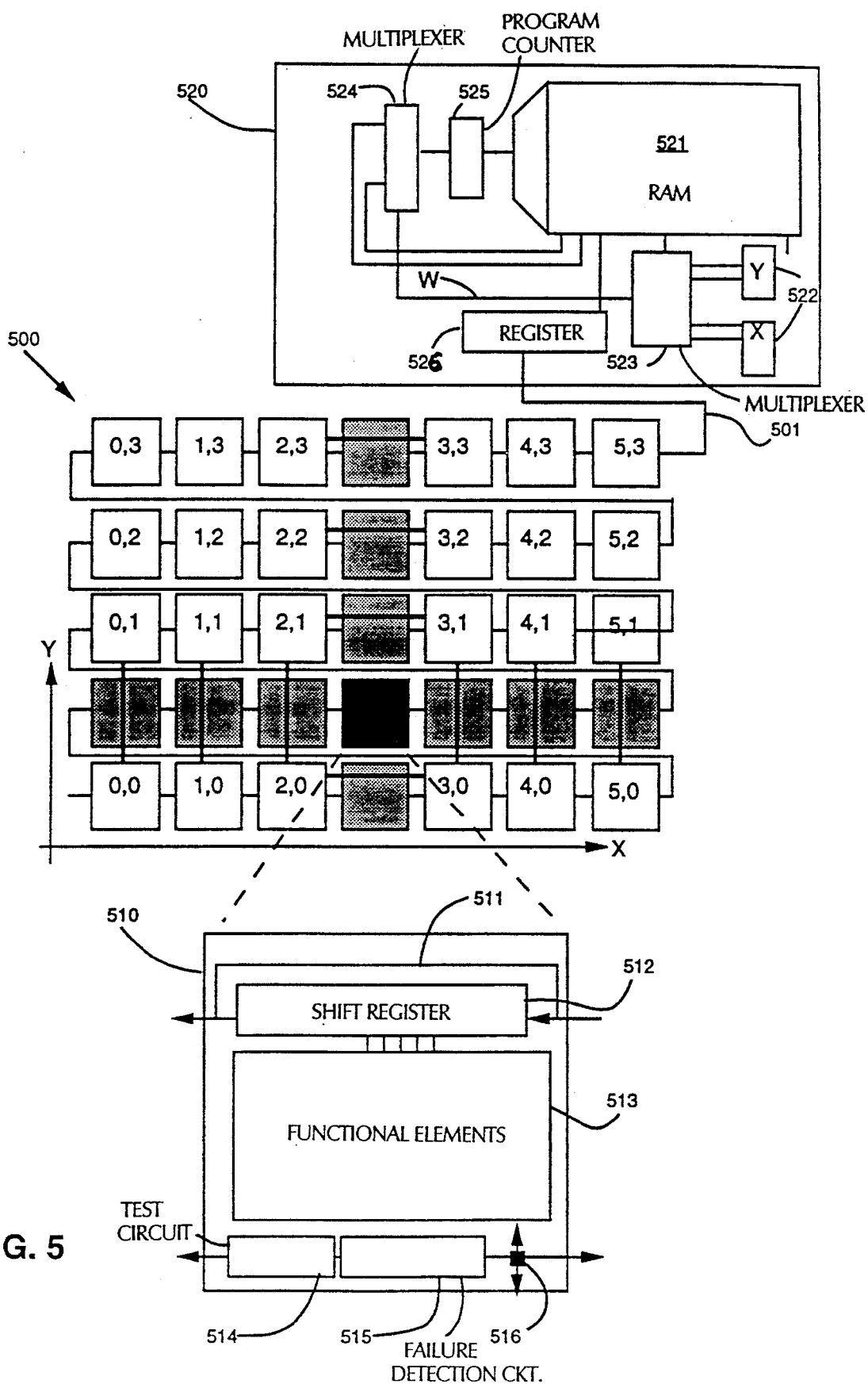
FIG. 5 shows another array of cells having unique programming means and means of reconfiguration in the event of failure of a cell.
Figure 6:
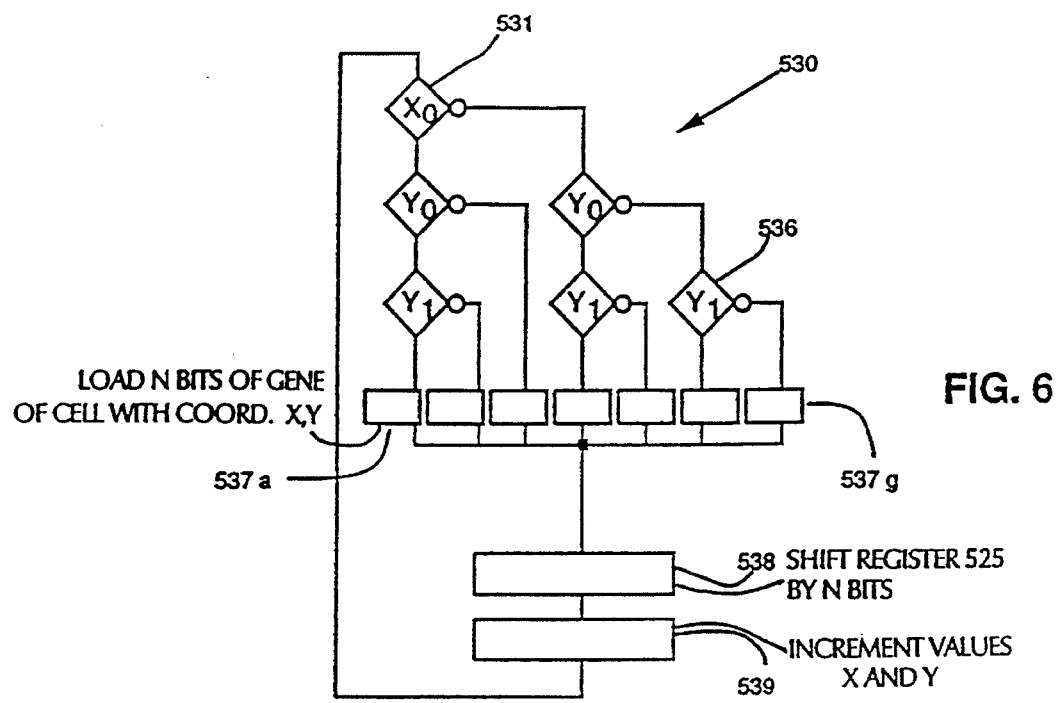
FIG. 6 shows an algorithm for generating cell genes in the array of FIG. 5.

FIG. 5 shows an example of an array including means for propagating the gene of each cell through the entire array and illustrating the possibility of deactivating all the cells in the row and column which correspond to the coordinates of a defective cell. The array 500 comprises 7×5 identical cells, for example of the type shown in FIG. 3, connected by a connection 501 to a binary decision machine 520. This binary decision machine is capable of supplying, in succession, the gene of each cell from the genome stored in the RAM memory 521. The binary decision machine 520 also comprises a position counter 522 which determines the coordinates of the cell in question, a multiplexer 523 which alternately supplies at its output W the value of the abscissa X or ordinate Y of the said cell, a multiplexer 524, a program counter 525 and a register 526 for storing the gene of the cell in question. The algorithm for generating the gene of each cell is shown in FIG. 6. This representation is analogous to the one in FIG. 1. Diamonds can be seen again therein, representing operations for testing the variable appearing inside, and rectangles representing operations of the "Execute" type. The rectangles 537a to 537g represent the operation "Load the n bits of the gene of the cell with coordinates X, Y", the rectangle 538 represents the operation "Shift the register 525 by n bits" and the rectangle 539 represents the operation "Increment the values of X and Y". This algorithm is executed by the binary decision machine 520. The latter generates, initially, the gene of the cell of coordinates (0, 0), then that of the cell of coordinates (1, 0) and so on until the gene of the cell of coordinates (5, 3). The genes stored successively in the register 525 are, at each cycle of the binary decision machine 520, transferred into the shift register (identical to the shift register 512 of the cell 510) of the first cell of coordinates (5, 3), whilst the gene previously recorded in the shift register of this cell is transferred into the shift register of the cell of coordinates (4, 3), and so on until the shift register of the last cell of coordinates (0, 0) receives the word representing its gene. Each cell such as the cell 510 shown in more detail comprises a shift register 512 storing the gene of this cell, a block 513 consisting of functional elements (such as a multiplexing circuit) and programming means (such as switches), a test circuit 514 which tests the correct functioning of the said functional elements and the said switches, a circuit for generating a failure signal 515 and means 516 for deactivating the cell when a failure signal is present. The effect of the said deactivation means is to make the cell perfectly transparent in the array; they may consist of switches which establish short-circuits between the terminals of the cell so that all the signals present at these terminals are transferred to the corresponding terminals of the adjacent cells. In addition, the failure signal for a defective cell is transmitted to all the cells in the same row and in the same column so that these can be deactivated in their turn. These deactivated cells are shown shaded in FIG. 5. The failure signal for a cell is also transmitted to the binary decision machine 520 which, as soon as it is received, repeats the programming of the array. It is clear that the array must, initially, consist of more cells than necessary in order to be able to allow the deactivation of the defective cells and the reprogramming of the system.

Figure 7:
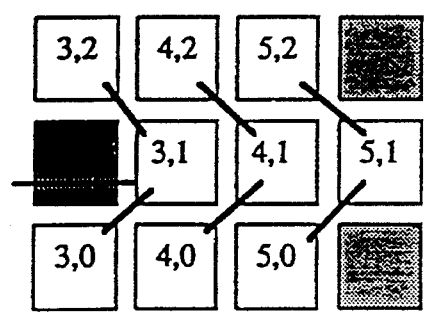
FIG. 7 shows another variant reconfiguration of the array in the event of failure of a cell.

The deactivation of all the cells located on the same row and the same column as the defective cell is a simple mechanism but somewhat expensive. FIG. 7 shows another variant according to which only the failed cell (in dark shading in the figure) is deactivated. Its function is taken over by the adjacent cell (to the right in the figure) and so on to the end of the row. Such a mechanism reduces the number of cells to be deactivated in the event of failure but is more difficult to implement than the mechanism described previously.

Figure 8:
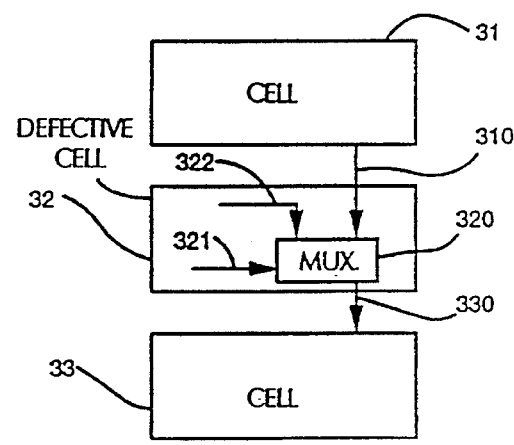
FIG. 8 shows a circuit enabling a cell in the same row as a defective cell to be deactivated.

Another variant consists or deactivating only the cells in the row, or column, containing a defective cell. FIG. 8 shows an example of a circuit which can be incorporated on cell input paths and which enables these inputs to be deactivated. For reasons of simplification, only one input is shown; it is clear, however, that the same circuit must be present at each input. The output 310 of the cell 31 is connected to an input of a multiplexer 320, a second input of which is connected to the input 322 of the cell 32; which input 322 corresponds to the output 310 of the cell 31. The multiplexer 320 is controlled by the failure signal of the cell 32 and connects, in accordance with this failure signal, one or other of its inputs to the output 330, which is the output of the cell 32 analogous to the output 310 of the cell 31.

In the above, it was assumed that a defective cell itself produced and transmitted its failure signal. However, it is not improbable that its means for processing and transmitting the failure signal might themselves be defective. In order to avoid such a situation, it is advantageous to make provision for each cell to test other cells, such as the cells adjacent to it, for example.

Many reconfiguration algorithms other than those described above may be used. By way of example, reference should be made to the article by Mengly Chean and Jose A B Fortes entitled "A Taxonomy of Reconfiguration Techniques for Fault-Tolerant Processor Arrays", which appeared in the journal "Computer" of January 1990.

We claim:

1. Integrated electronic system including an integrated circuit device comprising:

an array of identical cells, each cell comprising a plurality of functional components and first connecting means for connecting said functional components so that said cell is suitable for fulfilling a given function, and second connecting means for connecting each cell to its neighbours;

storage means for storing a first data item representing the functions of all the cells constituting said array;

extraction means for extracting, from said first data item stored, second data items, each of said second data items representing the function of a single one of said cells in the array, wherein the extraction means extracts said second data items for a particular cell by combining said first data item with a code representing a logical address of the particular cell; and programming means for programming, in each cell, said first and said second connecting means using said second data items, thus defining the function of each cell in the array.

2. Electronic system according to claim 1, characterised in that said storage means is common to all the cells in the array.

3. Electronic system according to claim 1 characterised in that the said storage means belong to each the cells in the array.

4. Electronic system according to any one of claim 1 characterised in that each cell comprises:

test means for testing the functioning of the functional components and or the connecting means of the cells which are adjacent to it and for transmitting to the latter a failure signal in the event of incorrect functioning;

deactivation means which, in response to the said failure signal, deactivate the said cell by short-circuiting its inputs and its outputs so that it is transparent in the array; and reconfiguration means for reprogramming another cell so that this said other cell can fulfil the function previously assigned to the defective cell.

5. Electronic system according to any one of claim 1 characterised in that each cell comprises:

test means for testing the functioning of its functional components and of its connecting means and for transmitting, to the cells adjacent to it, a failure signal in the event of incorrect functioning of one of the said adjacent cells;

deactivation means which, in response to the said failure signal, deactivate the defective cell, short-circuiting its inputs and its outputs so that it is transparent in the array; and reconfiguration means for reprogramming another cell so that this said other cell can fulfil the function previously assigned to the defective cell.

6. Electronic system according to claim 4 characterised in that said failure signal for a defective cell is transmitted to all the cells in the same row and column as this defective cell and in that the means of deactivating these cells are designed to as to deactivate them in response to said failure signal.

7. Electronic system according to claim 4 characterised in that the said failure signal for a defective cell is transmitted to all the cells in the same row as this defective cell and in that the means of deactivating these cells are designed so as to deactivate them in response to the said failure signal.

8. Electronic system according to claim 4 characterised in that the said failure signal for a defective cell is transmitted to all the cells in the same column as this defective cell and in that the means of deactivating these cells are designed so as to deactivate them in response to the said failure signal.

9. Electronic system according to claim 1, characterised in that said functional components comprise logic blocks.

10. Electronic system according to claim 1, characterised in that said functional components comprise analogue blocks.

* * * * *